(12) United States Patent
Yoder et al.

(10) Patent No.: US 8,809,912 B2
(45) Date of Patent: Aug. 19, 2014

(54) EPITAXIAL BASE LAYERS FOR HETEROJUNCTION BIPOLAR TRANSISTORS

(71) Applicants: Paul Douglas Yoder, Richmond Hill, GA (US); Munmun Islam, Atlanta, GA (US); Mahbub D. Satter, Atlanta, GA (US)

(72) Inventors: Paul Douglas Yoder, Richmond Hill, GA (US); Munmun Islam, Atlanta, GA (US); Mahbub D. Satter, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 13/910,710

(22) Filed: Jun. 5, 2013

(65) Prior Publication Data

US 2013/0320403 A1 Dec. 5, 2013

Related U.S. Application Data

(60) Provisional application No. 61/655,709, filed on Jun. 5, 2012.

(51) Int. Cl.
*H01L 29/205* (2006.01)
*H01L 29/737* (2006.01)
*H01L 29/10* (2006.01)
*H01L 29/15* (2006.01)
*H01L 29/66* (2006.01)
*H01L 29/20* (2006.01)

(52) U.S. Cl.
CPC .......... *H01L 29/737* (2013.01); *H01L 29/7378* (2013.01); *H01L 29/66242* (2013.01); *H01L 29/1004* (2013.01); *H01L 29/155* (2013.01); *H01L 29/2003* (2013.01)
USPC .......................................... 257/197; 438/312

(58) Field of Classification Search
None
See application file for complete search history.

(56) References Cited

U.S. PATENT DOCUMENTS 8,178,946 B1 * 5/2012 Li et al. ......................... 257/552
2012/0104360 A1 * 5/2012 Hardy et al. .................... 257/18

OTHER PUBLICATIONS

Lochner, Zachary, Hee Jin Kim, Yi-Che Lee, Yun Zhang, Suk Choi, Shyh-Chiang Shen, P. Doug Yoder, Jae-Hyun Ryou, and Russell D. Dupuis. "NpN-GaN/InxGa1—xN/GaN Heterojunction Bipolar Transistor on Free-standing GaN Substrate." Applied Physics Letters 99.19 (2011): 193501.*
Shen, Shyh-Chiang, Russell D. Dupuis, Zachery Lochner, Yi-Che Lee, Tsung-Ting Kao, Yun Zhang, Hee-Jin Kim, and Jae-Hyun Ryou. "Working toward High-power GaN/InGaN Heterojunction Bipolar Transistors." Semiconductor Science and Technology 28.7 (2013): 074025.*
Litvinov, V. I., A. Manasson, and D. Pavlidis. "Short-period Intrinsic Stark GaN/AlGaN Superlattice as a Bloch Oscillator." Applied Physics Letters 85.4 (2004): 600.*

(Continued)

*Primary Examiner* — Thomas L Dickey
*Assistant Examiner* — Joseph Schoenholtz
(74) *Attorney, Agent, or Firm* — Troutman Sanders LLP; Ryan A. Schneider; Dustin B. Weeks

(57) ABSTRACT

An exemplary embodiment of the present invention provides a heterojunction bipolar transistor comprising an emitter, a collector, and a base. The base can be disposed substantially between the emitter and collector. The base can comprise a plurality of alternating type-I and type-II layers arranged to form a short period super lattice. The type-I layers can have a band-gap that is narrower than the band-gap of the type-II layers. At least one of the type-I layers and the type-II layers can consist essentially of a quaternary material.

12 Claims, 5 Drawing Sheets

(56) References Cited

OTHER PUBLICATIONS

Li, D.-B., X. Dong, J. Huang, X. Liu, Z. Xu, Z. Zhang, and Z. Wang. "Alloy Compositional Fluctuation in InAlGaN Epitaxial Films." Applied Physics A 80.3 (2005): 649-52.*

P.C Chang, C Monier, A.G Baca, N.Y Li, F Newman, E Armour, H.Q Hou, High-speed InGaP/InGaAsN/GaAs NpN double heterojunction bipolar transistors with low turn-on voltage, Solid-State Electronics, vol. 46, Issue 4, Apr. 2002, pp. 581-584.*

Gorczyca, I., T. Suski, N. E. Christensen, and A. Svane. "Hydrostatic Pressure and Strain Effects in Short Period InN/GaN Superlattices." Applied Physics Letters 101.9 (2012): 092104.*

Rudolph, M., "Current Trends and Challenges in III-V HBT Compact Modeling", Proceedings of the 3rd European Microwave Integrated Circuits Conference, Amsterdam Oct. 2008 pp. 278-281.*

Tsai, Jung-Hui, I-Hsuan Hsu, Chien-Ming Li, Ning-Xing Su, Yi-Zhen Wu, and Yin-Shan Huang. "Comparison of Heterostructure-emitter Bipolar Transistors (HEBTs) with InGaAs/GaAs Superlattice and Quantum-well Base Structures." Solid-State Electronics 52.7 (2008): 1018-023.*

Tsai, J.H., et. al., "An InGaAs/GaAs Superlattice-Base Heterostructure-Emitter Bipolar Transistor (SB-HEBT)", 1st WSEAS Int. Conf. on Computational Chemistry, Cairo, Egypt, Dec. 29-31, 2007, pp. 141-144.*

* cited by examiner

EPITAXIAL BASE LAYERS FOR HETEROJUNCTION BIPOLAR TRANSISTORS

CROSS-REFERENCE TO RELATED APPLICATIONS

This application claims the benefit of U.S. Provisional Application Ser. No. 61/655,709, filed on 5 Jun. 2012, which is incorporated herein by reference in its entirety as if fully set forth below.

TECHNICAL FIELD OF THE INVENTION

The various embodiments of the present disclosure relate generally to semiconductor devices. More particularly, the various embodiments of the present invention are directed to heterojunction bipolar transistors and base layers for use therewith.

BACKGROUND OF THE INVENTION

Heterojunction bipolar transistors ("HBTs") have been in use for quite some time, particularly for use in signal amplifiers. The base regions of conventional HBTs were constructed using narrow band-gap materials. The use of these materials provided HBTs that worked well at high speeds, but were deficient in their ability to cope with high power applications. Accordingly, later conventional HBTs made use of type III-N materials in fabrication of the base region with wider band-gaps. While these III-N HBTs are capable of handling higher powers, they suffer many disadvantages. For example, it is difficult to make the base region sufficiently conductive, thus requiring very high activation energy to operate the HBT. Further, constraints placed on the base transit time and the base resistance continues to hold operating frequencies well below their theoretical maxima.

Increasing the conductivity in the base region may solve several disadvantages with conventional systems. For example higher p-type conductivity in the base region would lead to a reduction of the Early effect and enhance linearity. In order to achieve optimal performance for III-N HBTSs, it is highly desirable to exploit a more effective approach to increase the free hold concentration in the base to p>1019 cm−3, while simultaneously limiting the deleterious influence of neutral and ionized impurity scattering by Mg in the p-type materials. The minimization of base transit time and base resistance, however, represent conflicting design goals, and effective mitigation strategies have to date proven elusive.

Therefore, there is a desire for improved HBTs that address one of more of the disadvantages discussed above. Various embodiments of the present invention address these desires.

BRIEF SUMMARY OF THE INVENTION

The present invention relates to transistors and methods of fabricating transistors. An exemplary embodiment of the present invention provides heterojunction bipolar transistor comprising an emitter, a collector, and a base. The base can be disposed substantially between the emitter and the collector. The base can comprise a plurality of alternating type-I and type-II layers arranged to form a short period super lattice. The type-I layers can have a band-gap that is narrower than a band-gap of the type-II layers. At least one of the type-I layers and the type-II layers can consist essentially of a quaternary material.

In an exemplary embodiment of the present invention, the type-I layers can consist essentially of a ternary material and the type-II layers can consist essentially of a quaternary material.

In an exemplary embodiment of the present invention, the type-I layers can consist essentially of a first quaternary material and the type-II layers can consist essentially of a second quaternary material.

In an exemplary embodiment of the present invention, the type-I layers and the type-II layers can be epitaxially-grown layers.

In an exemplary embodiment of the present invention, the type-I and type-II layers can have substantially equal minimum energy levels.

In an exemplary embodiment of the present invention, the quaternary material can comprise indium, gallium, aluminum, and nitrogen.

In an exemplary embodiment of the present invention, at least one of the type-I layers and the type-II layers can be under a strain that alters a minimum energy level of the layers such that the minimum energy level is substantially equal to a minimum energy level of layers adjacent the at least one of the type-I layers and the type-II layers.

Another exemplary embodiment of the present invention provides a heterojunction bipolar transistor comprising an emitter region, a collector region and a base region. The base region can be disposed substantially between the emitter region and the collector region. The base region can comprise a plurality of alternating type-I and type-II layers arranged to form a short period super lattice. The type-I layers can have a band-gap that is narrower than a band-gap of the type-II layers. A majority portion of at least one of the type-I layers and the type-II layers can be comprised of a quaternary material.

In an exemplary embodiment of the present invention, a majority portion of each of the type-I layers can be comprised of a ternary material and a majority portion of each of the type-II layers can be comprised of a quaternary material.

In an exemplary embodiment of the present invention, a majority portion of each of the type-I layers can be comprised of a first quaternary material and a majority portion of each of the type-II layers can be comprised of a second quaternary material.

In an exemplary embodiment of the present invention, the type-I layers and the type-II layers can be epitaxially-grown layers.

In an exemplary embodiment of the present invention, the quaternary material can comprise indium, gallium, aluminum, and nitrogen.

In an exemplary embodiment of the present invention, at least one of the type-I layers and the type-II layers can be under a strain that alters a minimum energy level of the layers such that the minimum energy level is substantially equal to a minimum energy level of layers adjacent the at least one of the type-I layers and the type-II layers.

In addition to heterojunction bipolar transistors, various embodiments of the present invention provide methods of fabricating heterojunction bipolar transistors. An exemplary embodiment of the present invention provides a method of fabricating a heterojunction bipolar transistor comprising providing a substrate, depositing a collector region adjacent at least a portion of the substrate, depositing a plurality of alternating type-I and type-II layers together defining a base region, the base region positioned substantially adjacent at least a portion of the collector region, and depositing an emitter region adjacent at least a portion of the base region. At least one of the type-I layers and the type-II layers can consist essentially of a quaternary material.

In an exemplary embodiment of the present invention, the type-I layers can consist essentially of a ternary material and the type-II layers can consist essentially of a quaternary material.

In an exemplary embodiment of the present invention, the type-I layers can consist essentially of a first quaternary material and the type-II layers can consist essentially of a second quaternary material.

In an exemplary embodiment of the present invention, the deposition of the type-I layers and the type-II layers can be performed via an epitaxy process.

In an exemplary embodiment of the present invention, the type-I and type-II layers can have substantially equal minimum energy levels.

In an exemplary embodiment of the present invention, the quaternary material can comprise indium, gallium, aluminum, and nitrogen.

In an exemplary embodiment of the present invention, at least one of the type-I layers and the type-II layers is under a strain that alters a minimum energy level of the layers such that the minimum energy level is substantially equal to a minimum energy level of layers adjacent the at least one of the type-I layers and the type-II layers.

These and other aspects of the present invention are described in the Detailed Description of the Invention below and the accompanying figures. Other aspects and features of embodiments of the present invention will become apparent to those of ordinary skill in the art upon reviewing the following description of specific, exemplary embodiments of the present invention in concert with the figures. While features of the present invention may be discussed relative to certain embodiments and figures, all embodiments of the present invention can include one or more of the features discussed herein. Further, while one or more embodiments may be discussed as having certain advantageous features, one or more of such features may also be used with the various embodiments of the invention discussed herein. In similar fashion, while exemplary embodiments may be discussed below as device, system, or method embodiments, it is to be understood that such exemplary embodiments can be implemented in various devices, systems, and methods of the present invention.

BRIEF DESCRIPTION OF THE DRAWINGS

The following Detailed Description of the Invention is better understood when read in conjunction with the appended drawings. For the purposes of illustration, there is shown in the drawings exemplary embodiments, but the subject matter is not limited to the specific elements and instrumentalities disclosed.

DETAILED DESCRIPTION OF THE INVENTION

To facilitate an understanding of the principles and features of the present invention, various illustrative embodiments are explained below. To simplify and clarify explanation, the invention is described below as applied to heterojunction bipolar transistors. One skilled in the art will recognize, however, that the invention is not so limited. Instead, as those skilled in the art would understand, the various embodiments of the present invention also find application in other areas, including, but not limited to, other transistors and/or semiconductor device.

The components, steps, and materials described hereinafter as making up various elements of the invention are intended to be illustrative and not restrictive. Many suitable components, steps, and materials that would perform the same or similar functions as the components, steps, and materials described herein are intended to be embraced within the scope of the invention. Such other components, steps, and materials not described herein can include, but are not limited to, similar components or steps that are developed after development of the invention.

Figure 1A:
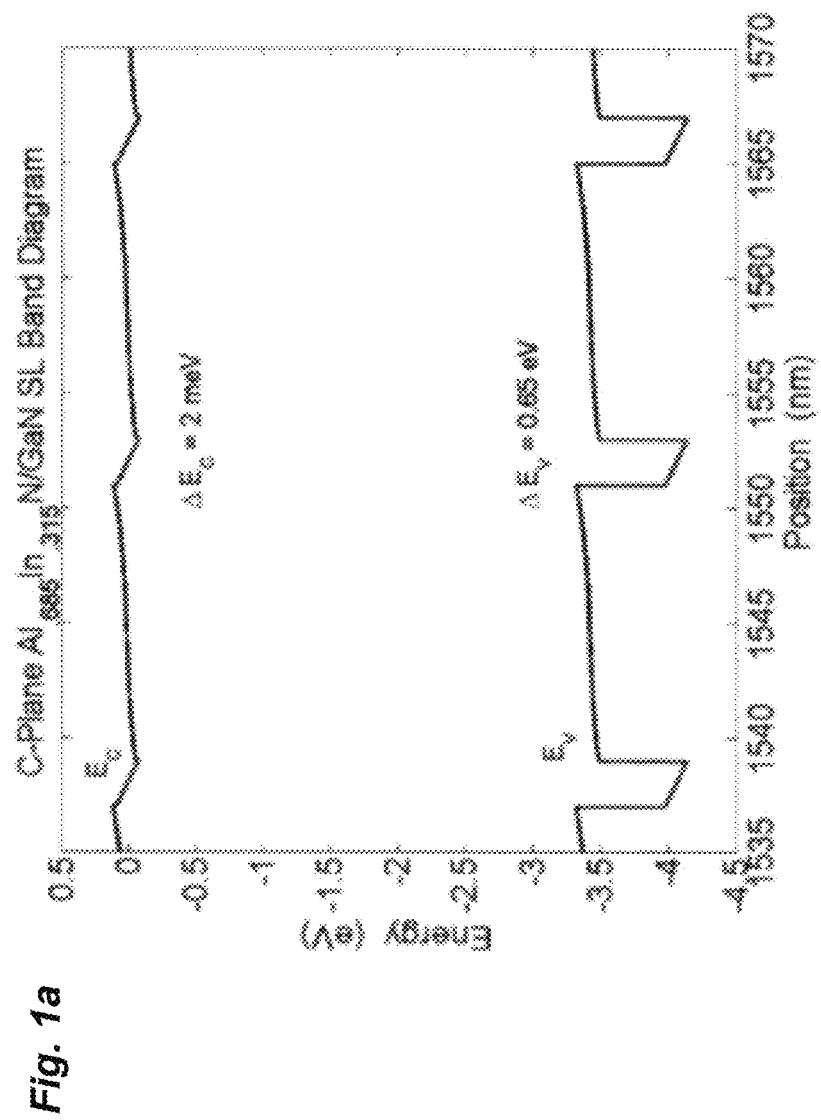
FIGS. 1a-1b provides an plot of heterojunctions at the cusp of type-I and type-II band alignment exhibiting minimal conduction band discontinuity, in accordance with an exemplary embodiment of the present invention.
Figure 1B:
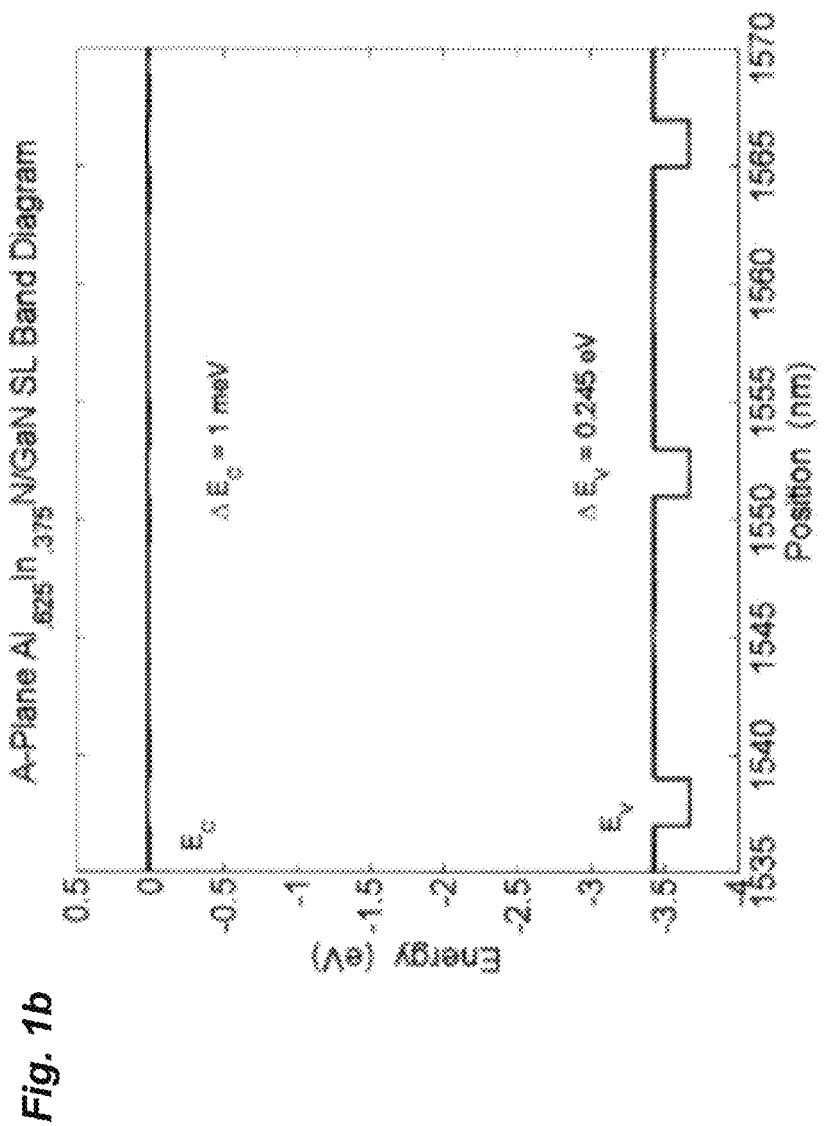
Figure 2:
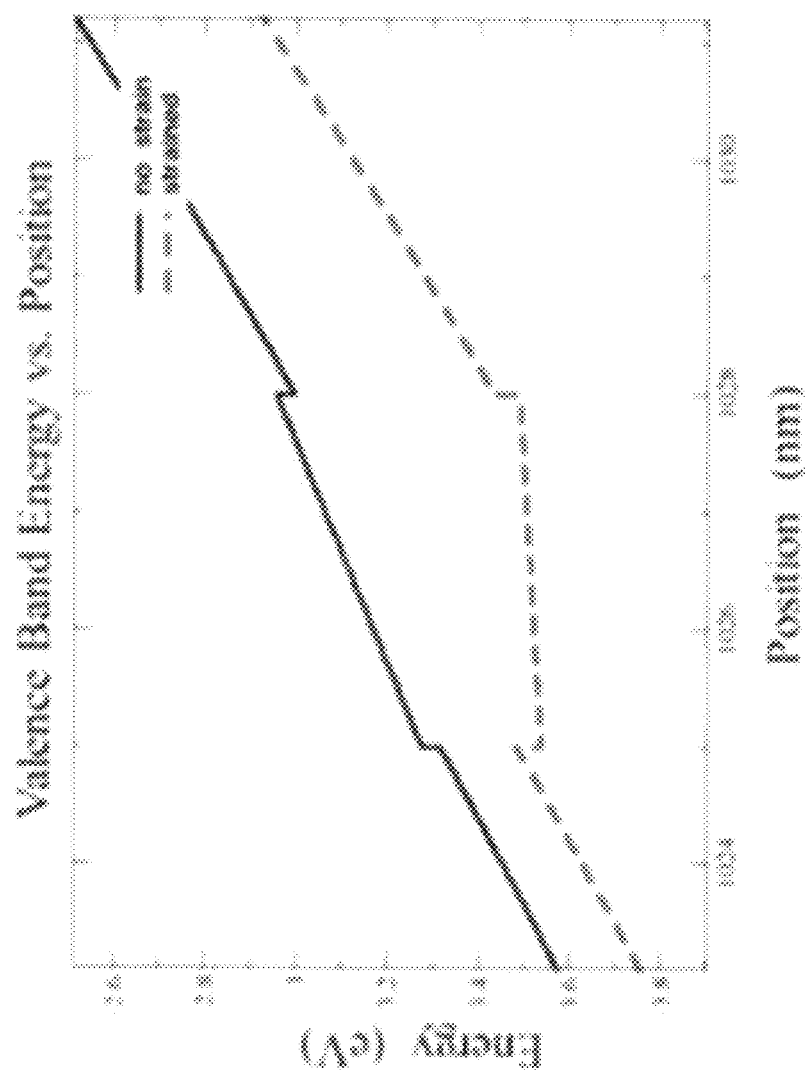
FIG. 2 provides a valance band profile at an InAlN/InAlN double heterojunction with and without consideration of strain, in accordance with an exemplary embodiment of the present invention.
Figure 3:
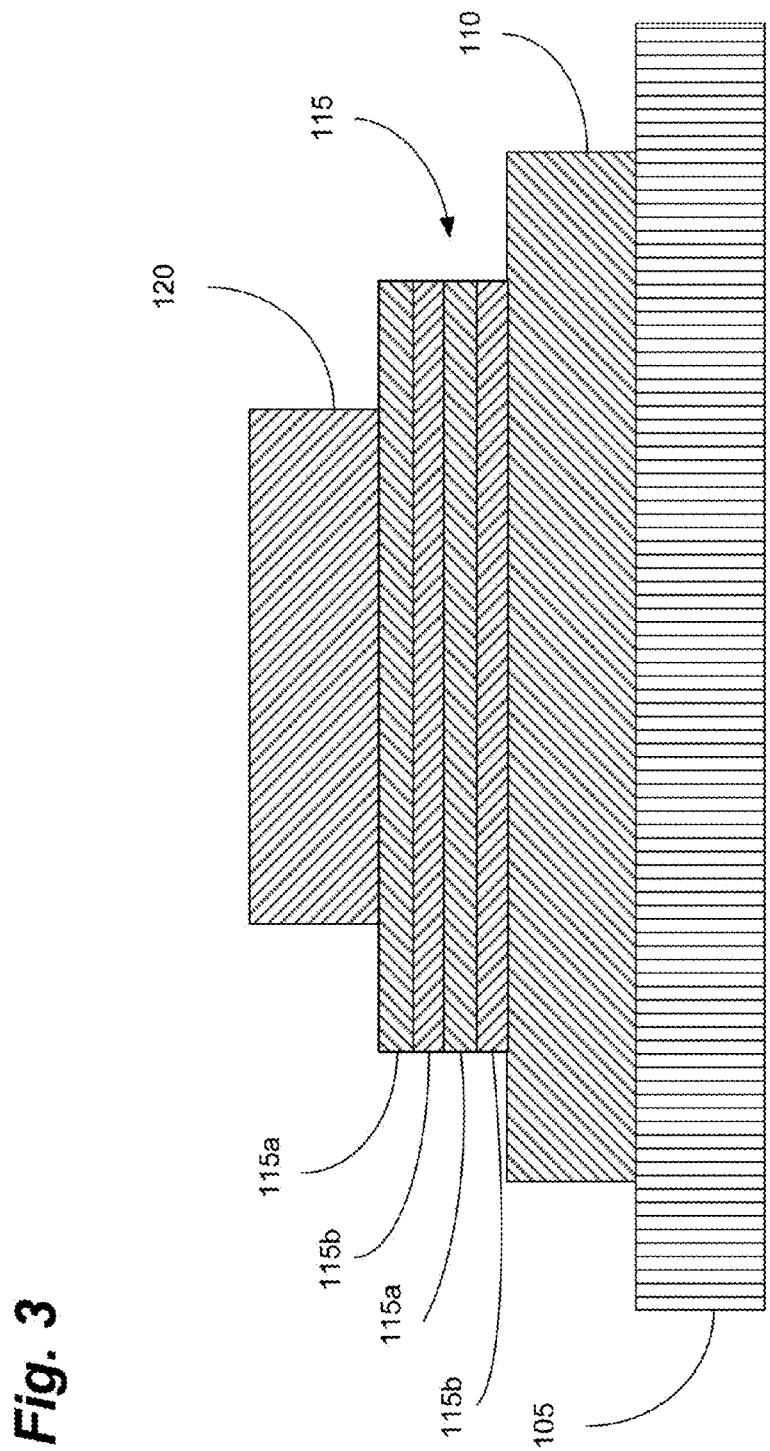
FIG. 3 provides a heterojunction bipolar transistor, in accordance with an exemplary embodiment of the present invention.
Figure 4:
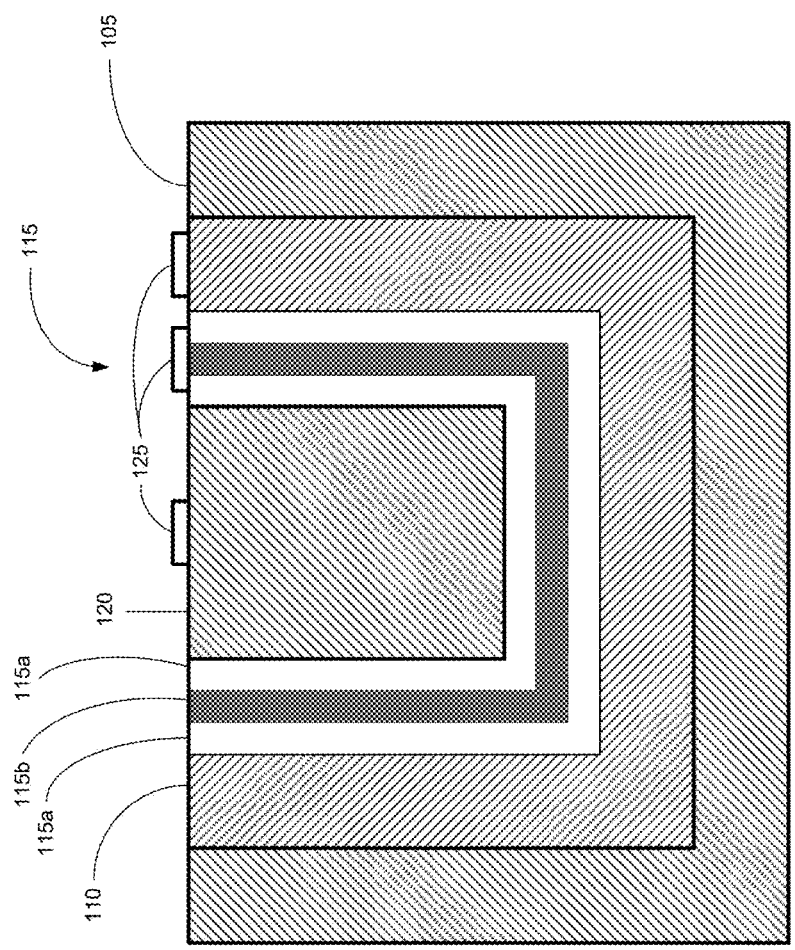
FIG. 4 provides a heterojunction bipolar transistor, in accordance with an exemplary embodiment of the present invention.

As shown in FIGS. 3-4, an exemplary embodiment of the present invention provides a heterojunction bipolar transistor comprising an emitter 120, a collector 110, and a base 115. The base 115 can be disposed substantially between the emitter 120 and the collector 110. The base 115 can comprise a plurality of alternating type-I 115a and type-II 115b layers arranged to form a short period super lattice. The type-I 115a and type-II 115b layers can have varying thicknesses, in accordance with various embodiments of the present invention. The type-I layers 115a can have a band-gap that is narrower than a band-gap of the type-II layers 115b. Thus, in some embodiments of the present invention, the different band-gaps for the type-I and type-II materials create multiple heterojunctions within the base 115. The base 115 of the present invention is not limited to any specific number of type-I 115a and type-II 115b layers. Instead, the base 115 may have many numbers of layers in accordance with various embodiments of the present invention. Additionally, as shown in FIGS. 3-4, the transistor can be fabricated on a substrate 105. Also, as shown in FIG. 4, the transistor can have one or more electrodes 125 for providing electrical communication with the emitter 120, base 115, or collector 110.

The type-I and type-II materials can be many different materials known in the art. In various embodiments of the present invention, the type-I and type-II materials can be ternary or quaternary materials. The use of Mg-doped short-period superlattice structures with ternary materials, e.g., GAn/InGaN, can be used to enhance the free hole concentration in the base layer well beyond what would otherwise by possible in bulk material. These devices can achieve excellent electrostatic control throughout the base region with a remote base electrode by virtue of enhanced lateral conductivity. The substantial reduction of extrinsic base resistance, however, comes with a high cost to base transport factor. Quantum wells formed by conduction band discontinuities within the superlattice ultimately proves to be so deep that electron traps form, compromising current gain.

Accordingly, various embodiments of the present invention make use of quaternary materials in the type-I or type-II materials. By exploiting heterojunctions on the cusp of type-I and type-II band alignment, the use of quaternary materials to form a superlattice structure in the base region can feature zero offset in conduction band energy for dramatic improvement in base transport factor, as well as sufficient discontinuity in valence band energy to ensure high lateral conductivity used for low extrinsic base resistance. In some embodiments of the present invention, at least one of the type-I layers and the type-II layers can consist essentially of a quaternary material. As used herein, a quaternary material is a material that intentionally comprises at least four separate elements. In some embodiments of the present invention, a majority portion of at least one of the type-I or type-II layers is comprised of a quaternary material. The particular selection of particular quaternary materials or the particular molar concentration of one or more components of the quaternary materials can be chosen based on the magnesium doping concentration in the transistor, so as to ionize magnesium atoms in the transistor. In some embodiments of the present invention, the quaternary materials of the type-I layers or the type-II layers can comprise indium, gallium, aluminum, and nitrogen. The scope of the present invention, however, is not so limited. Instead, as those skilled in the art would appreciate, the present quaternary materials of the present invention can comprise many different elements known in the art.

One or more layers/components of the present invention can be fabricated via epitaxial growth. In some embodiments of the present invention, the type-I and type-II layers can be epitaxially grown to induce strain in one or more of the layers. For example, due to the larger lattice constants of some materials and other materials, the type-I and/or type-II layers can be subjected to uniform biaxial compressive strain. The strain itself can represent an elastic deformation, fundamentally altering the microscopic crystal potential, and leading both to shifts in the energy of the conduction and the valence band edges, as well as modification to the electronic dispersion. These modifications can directly influence the quantum confined levels of the superlattice, their occupancy, and ultimately the superlattice conductivity. The strain can be induced via particular molar concentrations preselected for the one or more layers. The strain can alter the minimum energy level of the layers such that the minimum energy level is substantially constant between adjacent layers. This can substantially limit the number of electron traps forming in the base region, thus enabling the transfer of electrons across the base region. For example, through contrast in electron affinity and careful control of strain, the present invention can realize InAl(Ga)N/(In)GaN heterojunctions featuring a continuous spectrum of band alignments from type-I to type-II.

In addition to heterojunction bipolar transistors, various embodiments of the present invention provide methods of fabricating heterojunction bipolar transistors. An exemplary embodiment of the present invention provides a method of fabricating a heterojunction bipolar transistor comprising providing a substrate, depositing a collector region adjacent at least a portion of the substrate, depositing a plurality of alternating type-I and type-II layers together defining a base region, the base region positioned substantially adjacent at least a portion of the collector region, and depositing an emitter region adjacent at least a portion of the base region. At least one of the type-I layers and the type-II layers can consist essentially of a quaternary material.

It is to be understood that the embodiments and claims disclosed herein are not limited in their application to the details of construction and arrangement of the components set forth in the description and illustrated in the drawings. Rather, the description and the drawings provide examples of the embodiments envisioned. The embodiments and claims disclosed herein are further capable of other embodiments and of being practiced and carried out in various ways. Also, it is to be understood that the phraseology and terminology employed herein are for the purposes of description and should not be regarded as limiting the claims.

Accordingly, those skilled in the art will appreciate that the conception upon which the application and claims are based may be readily utilized as a basis for the design of other structures, methods, and systems for carrying out the several purposes of the embodiments and claims presented in this application. It is important, therefore, that the claims be regarded as including such equivalent constructions.

Furthermore, the purpose of the foregoing Abstract is to enable the United States Patent and Trademark Office and the public generally, and especially including the practitioners in the art who are not familiar with patent and legal terms or phraseology, to determine quickly from a cursory inspection the nature and essence of the technical disclosure of the application. The Abstract is neither intended to define the claims of the application, nor is it intended to be limiting to the scope of the claims in any way. Instead, it is intended that the invention is defined by the claims appended hereto.

What is claimed is:

1. A heterojunction bipolar transistor, comprising:
   an emitter;
   a collector; and
   a base disposed substantially between the emitter and collector, the base comprising a plurality of alternating type-I and type-II layers arranged to form a short period super lattice, the type-I layers having a band-gap that is narrower than a band-gap of the type-II layers, wherein at least one of the type-I layers and the type-II layers consist essentially of a quaternary material,
      wherein the type-I layers consist essentially of a first quaternary material and the type-II layers consist essentially of a second quaternary material.

2. The heterojunction bipolar transistor of claim 1, wherein the type-I layers and the type-II layers are epitaxially-grown layers.

3. The heterojunction bipolar transistor of claim 1, wherein at least one of the first quaternary material and the second quaternary material comprises indium, gallium, aluminum, and nitrogen.

4. The heterojunction bipolar transistor of claim 1, wherein at least one of the type-I layers and the type-II layers is under a strain that alters a minimum energy level of the layers such that the minimum energy level is substantially equal to a minimum energy level of layers adjacent the at least one of the type-I layers and the type-II layers.

5. A method of fabricating a base region for a heterojunction bipolar transistor, comprising:
   providing a substrate;
   depositing a collector region adjacent at least a portion of the substrate;
   depositing a plurality of alternating type-I and type-II layers together defining a base region, the base region positioned substantially adjacent at least a portion of the collector region; and
   depositing an emitter region adjacent at least a portion of the base region, wherein at least one of the type-I layers and the type-II layers consist essentially of a quaternary material,
      wherein the type-I layers consist essentially of a first quaternary material and the type-II layers consist essentially of a second quaternary material.

6. The method of claim 5, wherein the deposition of the type-I layers and the type-II layers is performed via an epitaxy process.

7. The method of claim 5, wherein at least one of the first quaternary material and the second quaternary material comprises indium, gallium, aluminum, and nitrogen.

8. The method of claim 5, wherein at least one of the type-I layers and the type-II layers is under a strain that alters a minimum energy level of the layers such that the minimum energy level is substantially equal to a minimum energy level of layers adjacent the at least one of the type-I layers and the type-II layers.

9. A heterojunction bipolar transistor, comprising:
an emitter region;
a collector region; and
a base region disposed substantially between the emitter region and the collector region, the base region comprising a plurality of alternating type-I and type-II layers arranged to form a short period super lattice, the type-I layers having a band-gap that is narrower than the band-gap of the type-II layers,
wherein a majority portion of at least one of the type-I layers and the type-II layers is comprised of a quaternary material, wherein a majority portion of each of the type-I layers is comprised of a first quaternary material and a majority portion of each of the type-II layers is comprised of a second quaternary material.

10. The heterojunction bipolar transistor of claim 9, wherein the type-I layers and the type-II layers are epitaxially-grown layers.

11. The heterojunction bipolar transistor of claim 9, wherein the quaternary material comprises indium, gallium, aluminum, and nitrogen.

12. The heterojunction bipolar transistor of claim 9, wherein at least one of the type-I layers and the type-II layers is under a strain that alters a minimum energy level of the layers such that the minimum energy level is substantially equal to a minimum energy level of layers adjacent the at least one of the type-I layers and the type-II layers.

* * * * *